United States Patent
Schaller et al.

(10) Patent No.: US 9,728,430 B2
(45) Date of Patent: Aug. 8, 2017

(54) ELECTROSTATIC CHUCK WITH LED HEATING

(71) Applicant: Varian Semiconductor Equipment Associates, Inc., Gloucester, MA (US)

(72) Inventors: Jason M. Schaller, Austin, TX (US); William T. Weaver, Austin, TX (US); Morgan D. Evans, Manchester, MA (US); Robert Brent Vopat, Austin, TX (US); Paul E. Pergande, Austin, TX (US); Julian G. Blake, Gloucester, MA (US); David Blahnik, Round Rock, TX (US); Ala Moradian, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 171 days.

(21) Appl. No.: 14/753,870

(22) Filed: Jun. 29, 2015

(65) Prior Publication Data
US 2016/0379853 A1 Dec. 29, 2016

(51) Int. Cl.
*H01L 21/683* (2006.01)
*H01T 23/00* (2006.01)
*H01L 21/67* (2006.01)

(52) U.S. Cl.
CPC .. *H01L 21/67115* (2013.01); *H01L 21/67109* (2013.01); *H01L 21/6831* (2013.01)

(58) Field of Classification Search
CPC .................... H01L 21/67115; H01L 21/6833
(Continued)

(56) References Cited

U.S. PATENT DOCUMENTS

| 8,404,499 B2 | 3/2013 | Moffatt | |
| 2005/0077280 A1* | 4/2005 | Ptak | C23C 16/481 |
| | | | 219/390 |

(Continued)

FOREIGN PATENT DOCUMENTS

JP  10-229112 A  8/1998

OTHER PUBLICATIONS

Morgan D. Evans, Dynamic Heating Method and Syetern for Wafer Processing, U.S. Appl. No. 14/575,591, filed Dec. 18, 2014.
(Continued)

*Primary Examiner* — Thienvu Tran
*Assistant Examiner* — Lucy Thomas
(74) *Attorney, Agent, or Firm* — Nields, Lemack & Frame, LLC (57) ABSTRACT

An electrostatic chuck with LED heating is disclosed. The electrostatic chuck with LED heating comprises a first subassembly, which comprises a LED heater, and a second subassembly, which comprises an electrostatic chuck. The LED substrate heater subassembly includes a base having a recessed portion. A plurality of light emitting diodes (LEDs) is disposed within the recessed portion. The LEDs may be GaN or GaP LEDs, which emit light at a wavelength which is readily absorbed by silicon, thus efficiently and quickly heating the substrate. The second subassembly, which comprises an electrostatic chuck, is disposed on the LED substrate heater subassembly. The electrostatic chuck includes a top dielectric layer and an interior layer that are transparent at the wavelength emitted by the LEDs. One or more electrodes are disposed between the top dielectric layer and the interior layer to create the electrostatic force.

20 Claims, 8 Drawing Sheets

(58) Field of Classification Search
USPC .......................................................... 361/234
See application file for complete search history.

(56) References Cited

U.S. PATENT DOCUMENTS

| | | | |
|---|---|---|---|
| 2011/0092072 A1* | 4/2011 | Singh | C23C 14/541 |
| | | | 438/710 |
| 2013/0052834 A1 | 2/2013 | Kielwein et al. | |
| 2013/0126509 A1* | 5/2013 | He | H01L 21/67115 |
| | | | 219/209 |
| 2013/0220989 A1 | 8/2013 | Pease et al. | |
| 2013/0224675 A1* | 8/2013 | Park | F27D 5/0037 |
| | | | 432/253 |
| 2014/0042716 A1 | 2/2014 | Miura et al. | |
| 2014/0061180 A1* | 3/2014 | Petry | H05B 3/0047 |
| | | | 219/201 |
| 2015/0043122 A1 | 2/2015 | Eto et al. | |

OTHER PUBLICATIONS

Morgan D. Evans, Hybrid Thermal Electrostatic Clamp, U.S. Appl. No. 14/688,000, filed Apr. 16, 2015.
International Search Report and Written Opinion mailed Sep. 12, 2016 in corresponding PCT application No. PCT/US2016/039277.

* cited by examiner

ELECTROSTATIC CHUCK WITH LED HEATING

FIELD

Embodiments of the present disclosure relate to electrostatic chucks for clamping a substrate, and more particularly, to electrostatic chucks that utilize LEDs disposed beneath the substrate to heat the substrate while the substrate is clamped to the chuck.

BACKGROUND

The fabrication of a semiconductor device involves a plurality of discrete and complex processes. The semiconductor substrate typically undergoes many processes during the fabrication process. As a substrate is being processed, the substrate is typically clamped to a chuck. This clamping may be mechanical or electrostatic in nature. The electrostatic chuck traditionally consists of a plurality of layers. The top layer, also referred to as the top dielectric layer, contacts the substrate, and is made of an electrically insulating or semiconducting material, since it produces the electrostatic field without creating a short circuit. Methods of creating this electrostatic field are known to those skilled in the art. The electrostatic force can be generated by an alternating voltage (AC) or by a constant voltage (DC) supply. To create the electrostatic force, a plurality of electrodes may be disposed beneath the top dielectric layer. The plurality of electrodes is constructed from an electrically conductive material, such as a metal.

In certain applications, ion implantation may result in crystal defects and amorphization. This crystalline damage can often be restored by thermal processing, known as annealing. However, for certain high dose implants and device structures, typical post-implant annealing may not be sufficient to restore all the damage caused by the implantation. Heating the substrate during the implant process is known to reduce damage to the substrate and to preserve more of the crystalline structure to facilitate regrowth during the anneal process.

Substrates are typically heated by contact, such as through the use of a gas trapped between the workpiece and the chuck, such as when the substrate is held in place through electrostatic forces. The substrate may also be directly heated by the chuck. In both embodiments, heat is applied to the lower surface of the substrate by the chuck. These methods may suffer from certain drawbacks. For example, the temperature to which the electrostatic chuck is heated may be excessive and place thermal stresses on the electrostatic chuck itself. This may reduce the reliability of the electrostatic chuck, and may also add significant cost to the electrostatic chuck.

It would be beneficial if there were an electrostatic chuck that could be used to clamp and heat the substrate, without suffering from these disadvantages. Further, it would be advantageous if that electrostatic chuck could also cool the substrate after the processing is completed.

SUMMARY

An electrostatic chuck with LED heating is disclosed. The electrostatic chuck with LED heating comprises a first subassembly, which comprises a LED heater, and a second subassembly, which comprises an electrostatic chuck. The LED heater includes a base having a recessed portion defined by sidewalls. A plurality of light emitting diodes (LEDs) is disposed within the recessed portion. The LEDs may be GaN or GaP LEDs, which emit light at a wavelength which is readily absorbed by silicon, thus efficiently and quickly heating the substrate. The second subassembly, which comprises an electrostatic chuck, is disposed on the LED heater. The electrostatic chuck includes a top dielectric layer and an interior layer that are transparent at the wavelength emitted by the LEDs. One or more electrodes are disposed between the top dielectric layer and the interior layer to create the electrostatic force.

According to one embodiment, an apparatus is disclosed. The apparatus comprises a sealed enclosure containing an electrical circuit comprising a plurality of LEDs, wherein a top surface of the sealed enclosure comprises an electrostatic chuck. In certain embodiments, the sealed enclosure is filled with an encapsulate to remove air.

According to another embodiment, an electrostatic chuck with LED heating is disclosed. The electrostatic chuck comprises a base having a recessed portion defined by sidewalls; an electrical circuit, comprising a plurality of LEDs, disposed in the recessed portion; an interior layer disposed on top of the sidewalls and covering the recessed portion; a top dielectric layer; and an electrode disposed between the interior layer and the top dielectric layer, wherein the interior layer and the top dielectric layer are transparent at a wavelength emitted by the plurality of LEDs. In certain embodiments, the electrostatic chuck further comprises an encapsulate which fills a remaining volume of the recessed portion. In certain embodiments, the encapsulate is transparent at the wavelength emitted by the plurality of LEDs.

According to another embodiment, an electrostatic chuck with LED heating is disclosed. The electrostatic chuck comprises a base having a recessed portion defined by sidewalls; an electrical circuit, comprising a plurality of LEDs, disposed in the recessed portion; an interior layer disposed on top of the sidewalls and covering the recessed portion to form a sealed enclosure; an encapsulate filling a remaining volume of the sealed enclosure; a top dielectric layer; and an electrode disposed between the interior layer and the top dielectric layer, wherein the encapsulate, the interior layer, the electrode and the top dielectric layer are transparent at a wavelength emitted by the plurality of LEDs.

BRIEF DESCRIPTION OF THE FIGURES

For a better understanding of the present disclosure, reference is made to the accompanying drawings, which are incorporated herein by reference and in which.

DETAILED DESCRIPTION

As described above, in many applications, it may be advantageous to heat the substrate while the substrate is clamped to an electrostatic chuck. Traditionally, this heating is performed using conduction, where the heat contained in the electrostatic chuck is transferred to the substrate, often through the use of back side gas. As described above, this implementation has many drawbacks.

The electrostatic chuck with LED heating described herein overcomes many of these issues through the use of radiant heat. The electrostatic chuck with LED heating heats the substrate through the use of light energy. Advantageously, this light energy increases the temperature of the electrostatic chuck to a much lesser degree than is done in traditional systems.

Electrostatic chucks are often employed in processing chambers that are maintained at vacuum conditions. The use of vacuum conditions presents many challenges to the design of an electrostatic chuck with LED heating. For example, the choice of materials that may be used to construct the electrostatic chuck may be limited, as many materials may outgas, contaminating the processing chamber. Additionally, sealed enclosures disposed within the processing chamber may have a pressure differential between the interior of the enclosure and the processing chamber, which may put significant or unacceptable stress on the walls of that sealed enclosure.

The electrostatic chuck with LED heating described herein is made up of two subassemblies. The first subassembly is a LED substrate heater that provides the light energy to the underside of the substrate. The second subassembly is the electrostatic chuck, which creates the electrostatic force that clamps the substrate to the chuck. As described in more detail below, the electrostatic chuck is disposed on top of the LED substrate heater.

Figure 1:
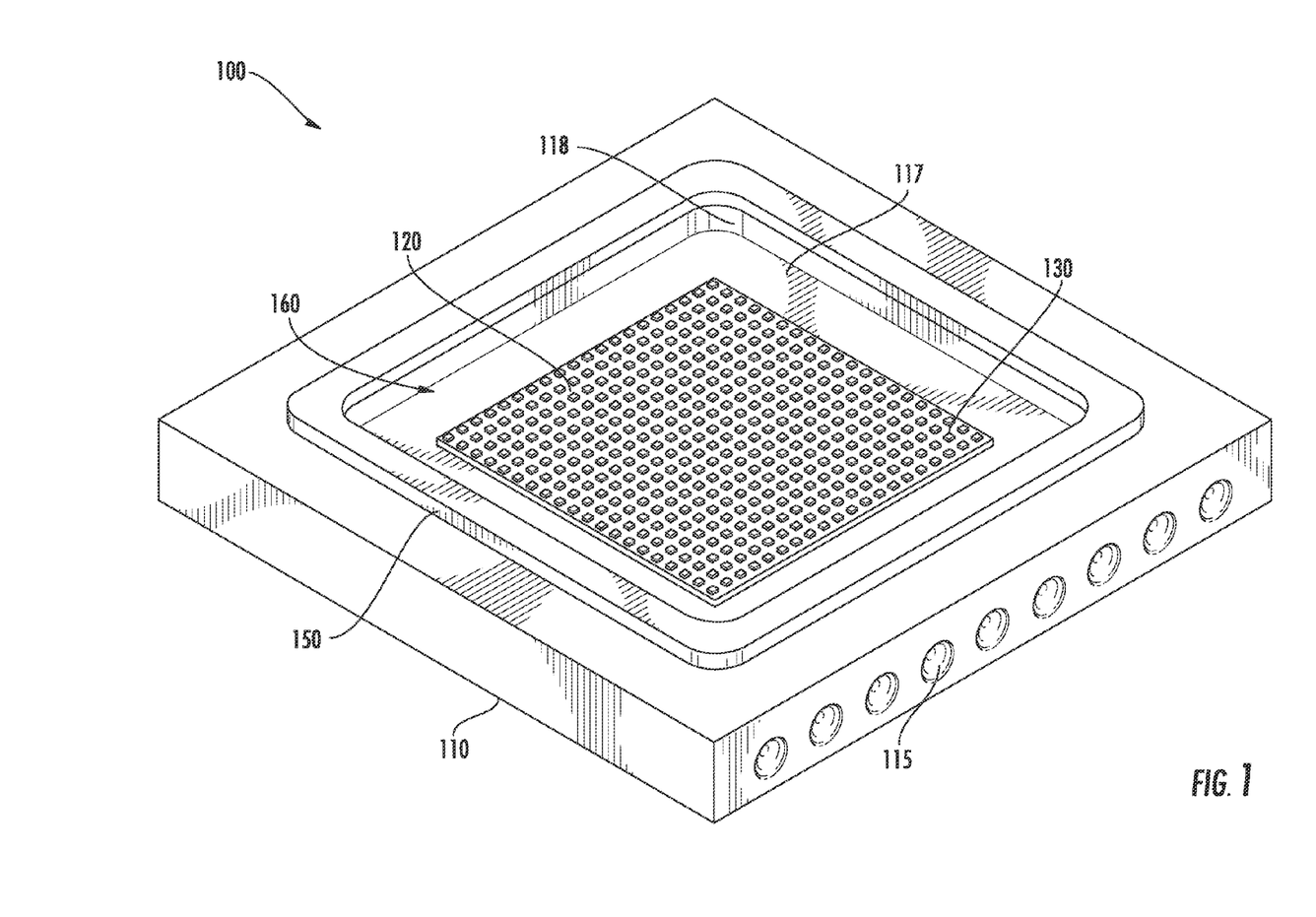
FIG. 1 is a perspective view of a substrate heating subassembly according to one embodiment.

FIG. 1 shows a perspective view of a first embodiment of a LED substrate heater subassembly 100, which is compatible with vacuum conditions.

The LED substrate heater subassembly 100 includes a base 110, which may be constructed of a thermally conductive material, such as aluminum, copper or other suitable materials. The base 110 may have a length and a width, which in certain embodiments, may be the same dimension. The example, the length and width of the base 110 may form a square, having a dimension greater than diameter of the substrate that the LED substrate heater subassembly is configured to heat. For example, if the substrate is a silicon wafer having a diameter of 300 mm, the length and width of the base 110 may be large enough to accommodate an array of LEDs that is at least as large as the wafer. In other embodiments, the base 110 may be circular, having a diameter equal to or greater than that of the substrate that is disposed on it. For example, in one embodiment, the substrate has a diameter of 300 mm, and the array of LEDs disposed in the base 110 has a diameter greater than 300 mm to insure uniform heating. For example, the array of LEDs 130 may have a diameter of 330 mm.

The base 110 may also have a height, orthogonal to the length and the width. The height of the base 110 may be less than 0.5 inches in certain embodiments. Disposed within the base 110 may be one or more conduits 115. These conduits 115 may extend through the length of the base 110, entering on one side and exiting on the opposite side of the base 110. In certain embodiments, the conduits 115 may be at least partially threaded, allowing a similarly threaded hose or tube to be inserted in the conduit 115 and affixed to the base 110. In operation, a fluid, such as water, another liquid or a gas, travels through the hose and passes through the conduits 115. This action allows the heat contained within the base 110 to be removed by the flowing fluid. Thus, conduits 115 serve as coolant channels. In other embodiments, the base 110 may be disposed on a thermal mass that serves as a heat sink. In these embodiments, the conduits 115 may not be employed.

The top surface of the base 110 may have a recessed portion 117 that is surrounded by sidewalls 118. The recessed portion 117 may be sized so as to accommodate a printed circuit board 120. As noted above, the printed circuit board 120 may be equal to, or slightly larger, than the substrate that is to be heated. The top surface of the recessed portion 117 may be polished to increase its ability to reflect incident radiation from the substrate or the LEDs. While FIG. 1 shows a square base 110 having a square recessed portion 117, other embodiments are also possible. For example, the base 110 and the recessed portion 117 may both be circular. In another embodiment, one of the base 110 and the recessed portion 117 is square while the other is circular.

While FIG. 1 shows the base 110 as an integral component having a recess therein, other embodiments are also possible. For example, the base may have a flat top surface. Sidewalls, which are separate from the base, may be disposed around the perimeter of the base on its top surface. In this embodiment, the volume defined by the sidewalls and above the base is considered the recessed portion. Thus, the phrase "a base with a recessed portion" is not intended to be limited to only an integral component having a recess. Rather, it also includes other configurations that can be used to create a volume that can accommodate the LEDs and can be sealed.

The printed circuit board 120 may include a plurality of high power LEDs 130, which emit light of a wavelength or a plurality of wavelengths that is readily absorbed by the substrates. For example, silicon exhibits high absorptivity and low transmissivity in the range of wavelengths between about 0.4 and 1.0 μm. Silicon absorbs more than 50% of the energy emitted in the range of wavelengths from 0.4 to 1.0 μm. LEDs that emit light in this range of wavelengths may be used. In certain embodiments, LEDs made from GaN are employed. These GaN LEDs emit light at a wavelength of about 450 nm. In certain embodiments, GaP LEDs are employed, which emit light at a wavelength between 610 and 760 nm.

The LEDs 130 may be varied in size. In certain embodiments, each LED may be 1.3 mm×1.7 mm. In another embodiment, each LED 130 may be 1 mm×1 mm. Of course, LEDs of other dimensions are also within the scope of the disclosure. The density of the LEDs 130 on the printed circuit board 120 may vary. For example, in one embodiment, a density of 8.65 LEDs/cm$^2$ may be used. In another embodiment, a density of 18.1 LEDs/cm$^2$ may be used. In other embodiments, densities of up to 78 LEDs/cm$^2$ may be used. As such, the density of the LEDs 130 is not limited by the disclosure.

Figure 9:
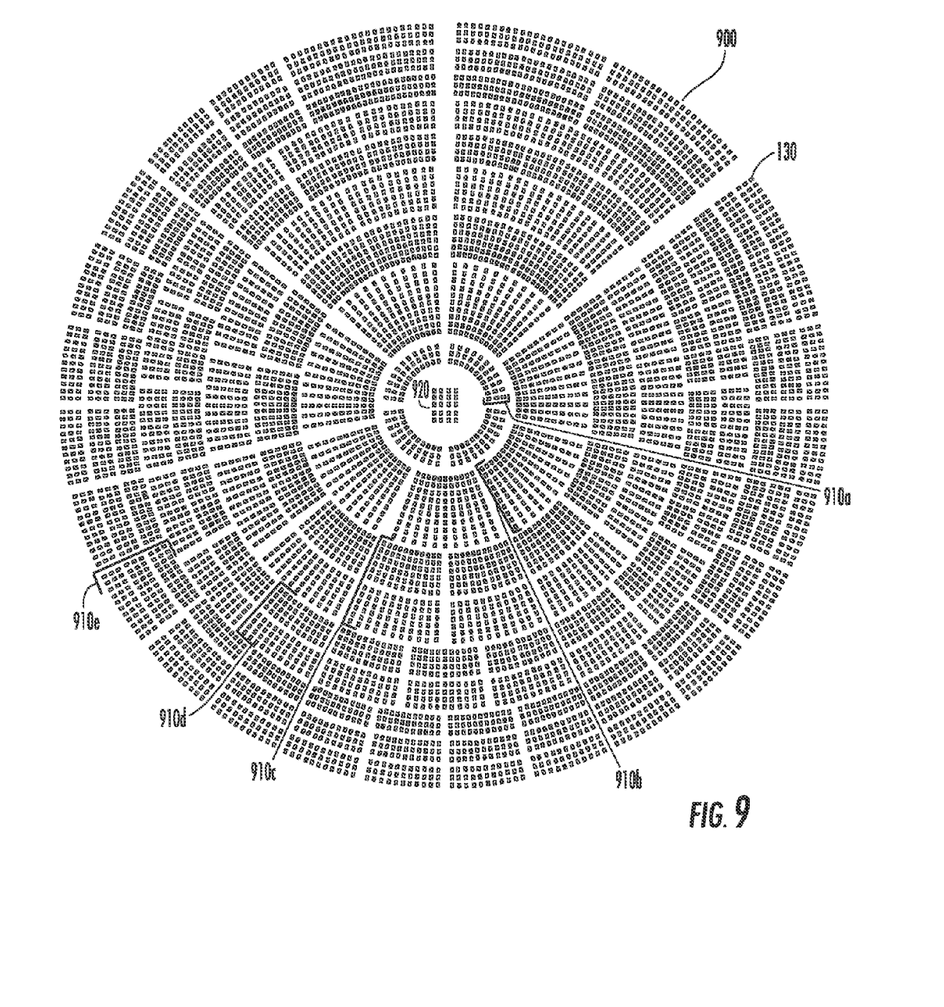
FIG. 9 shows a representative pattern that may be used for the LEDs.

The LEDs 130 may be disposed as a regular array having a fixed number of rows and columns, such as is shown in FIG. 1. In other embodiments, the LEDs 130 may be spaced in a non-uniform manner to optimize the heating of the substrate. In certain embodiments, the LEDs 130 may be arranged in a plurality of concentric circles, where each circle may or may not have the same number of LEDs. In certain embodiments, the number of LEDs in each concentric circle may be related to the radius of that particular circle, such that outer concentric circles may have more LEDs than inner concentric circles. FIG. 9 shows a representative pattern of LEDs 130 that are arranged in concentric circles. In this embodiment, the concentric circles 900 are organized in bands 910a, 910b, 910c, 910d, 910e, where all of the circles in a particular band all have the same number of LEDs 130. Of course, other configurations are also possible. Specifically, in outermost band 910e, which is furthest from the center of the pattern, each concentric circle 900 may have about 308 LEDs. There may be about 9 concentric circles 900 in outermost band 910e. In contrast, in innermost band 910a, which is closest to the center, the concentric circles 900 may each have only 44 LEDs. There may be about 3 concentric circles 900 in the innermost band 910a. The concentric circles 900 in bands 910b, 910c and 910d, which are located between innermost band 910a and outermost band 910e, may have 77, 154 and 231 LEDs, respectively. There may be 10 concentric circles in band 910b, 12 concentric circles 900 in band 910c and 8 concentric circles 900 in band 910d. Inside of the innermost band 910a, there may be a small rectangular array 920 of LEDs, which are organized as rows and columns, such as 5 rows and 5 columns. Of course, the pattern of LEDs may include a different number of bands, which may have any number of LEDs. Further, the number of concentric circles 900 in each band may be different from that described above. Therefore, the configuration of LEDs 130 is not limited by this disclosure.

Referring to FIG. 1, the LEDs 130 are electrically connected to a power source (not shown) through the printed circuit board 120. In certain embodiments, the printed circuit board 120 may be a metal core printed circuit board. Metal core printed circuit boards utilize a metal base layer, which may help conduct heat away from the LEDs 130 disposed on the printed circuit board 120. In certain embodiments, the printed circuit board 120 is thermally bonded to the top surface on the recessed portion 117 through the use of a thermal bonding agent (not shown). In other embodiments, the printed circuit board 120 may be physically attached to the base 110, such as by screws or more fastening means (not shown). The fastening means may insure physical contact between the underside of the printed circuit board 120 and the top surface of the recessed portion 117 to insure thermal conduction.

In embodiments where the LED substrate heater subassembly 100 is to be used in vacuum conditions, an encapsulate 160 may be used to fill the remaining volume of the recessed portion 117. After the printed circuit board 120 has been installed, the encapsulate 160, which may be in liquid form, may then fill the remaining volume of the recessed portion 117 up to the level of the sidewalls 118. In this way, no air remains in the recessed portion 117. After the encapsulate 160 is poured or otherwise introduced into the recessed portion 117, the encapsulate 160 may be cured to form a solid material. The encapsulate 160 may be selected so as to be transparent at the wavelengths emitted by the LEDs 130. The term "transparent" is intended to describe the property wherein at least 80% of the light energy emitted by the LEDs 130 passes through the encapsulate. Further, the encapsulate 160 may be selected such that the material does not outgas in a vacuum environment. In certain embodiments, the encapsulate 160 may be silicone. In other embodiments, other clear epoxy materials, such as polyurethane, may be used. As described above, a sealed enclosure may have differential pressure between the interior and the vacuum chamber. By removing the air from the recessed portion 117 through the use of an encapsulate 160, this pressure differential may be eliminated. The encapsulate 160 may also serve as a mechanical support for the electrostatic chuck. In certain embodiments, the encapsulate 160 may be used to hold the electrostatic chuck in place, such that fasteners are not needed.

In embodiments where the LED substrate heater subassembly 100 is not disposed in vacuum conditions, the encapsulate 160 may or may not be employed. For example, in environments that operate at or near atmospheric pressure, no pressure differential exists between the interior of the recessed portion 117 and the exterior. Thus, the encapsulate 160 may not be used in these embodiments.

A sealing gasket 150 may be disposed on the top of sidewalls 118. In embodiments where the sidewalls 118 are separate from the base 110, a sealing gasket may also be disposed between the sidewalls 118 and the base 110. The sealing gasket 150 may be made from Viton® or any suitable material. These materials may be selected due to their compatibility with vacuum conditions.

Figure 2:
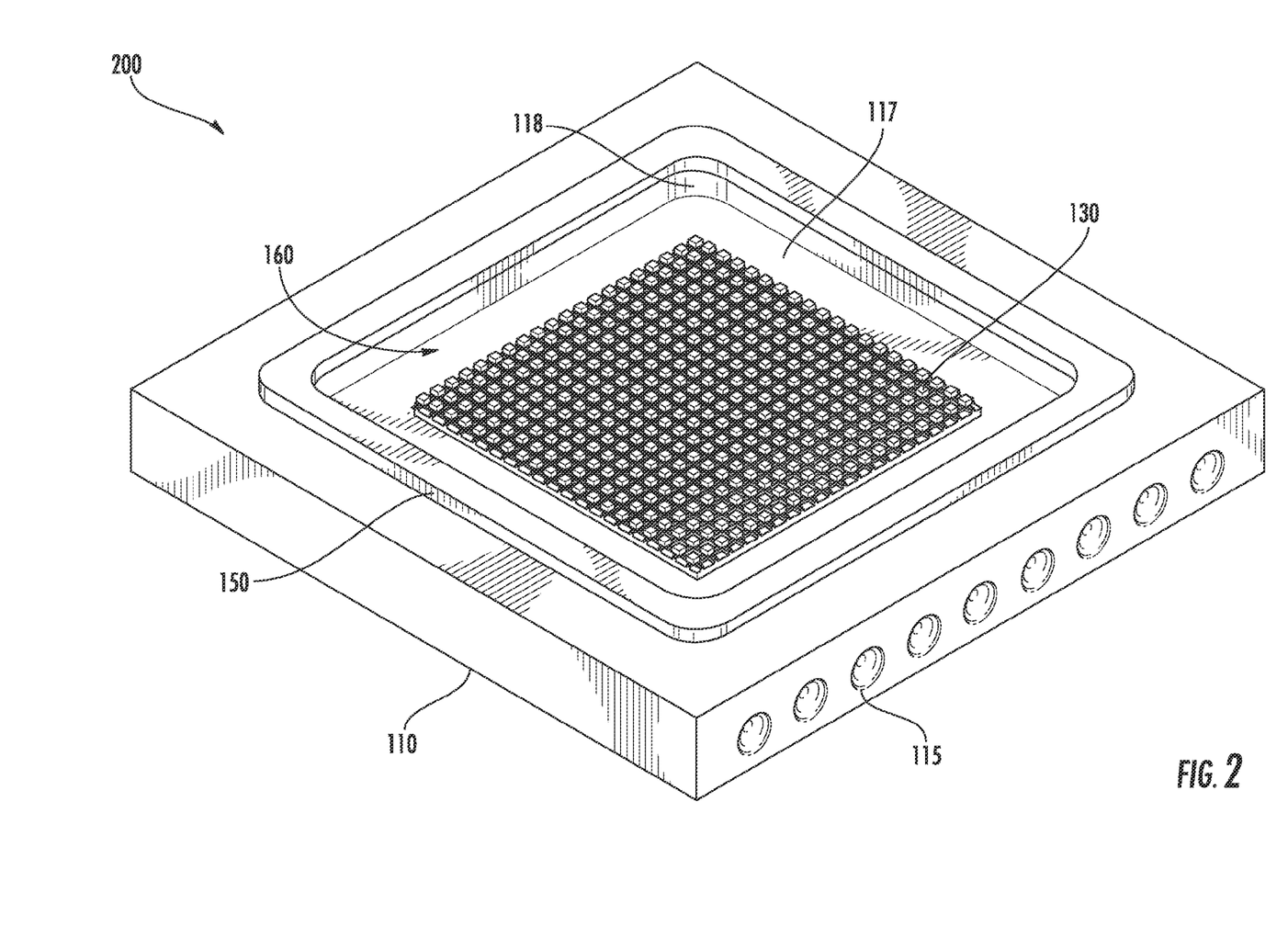
FIG. 2 is a perspective view of a substrate heating subassembly according to another embodiment.

While FIG. 1 shows a printed circuit board 120 disposed in the recessed portion 117, other embodiments are also within the scope of the disclosure. For example, FIG. 2 shows a perspective view of a second embodiment of a LED substrate heater subassembly 200. Components that are shared between these two embodiments have been given identical reference designators.

In this embodiment, the printed circuit board is replaced by a plurality of thick film insulating and conductive traces, which are disposed directly on the top surface of the recessed portion 117. Like the previous embodiment, the LED substrate heater subassembly 200 comprises a base 110 which may have conduits 115. The base 110 has a recessed portion 117 surrounded by sidewalls 118. As described above, the sidewalls 118 may be integral with the base 110, or may be separate components. A sealing gasket 150 may be disposed on the sidewalls 118. An encapsulate 160 may be disposed in the recessed portion 117 created by the sidewalls 118.

Figure 3:
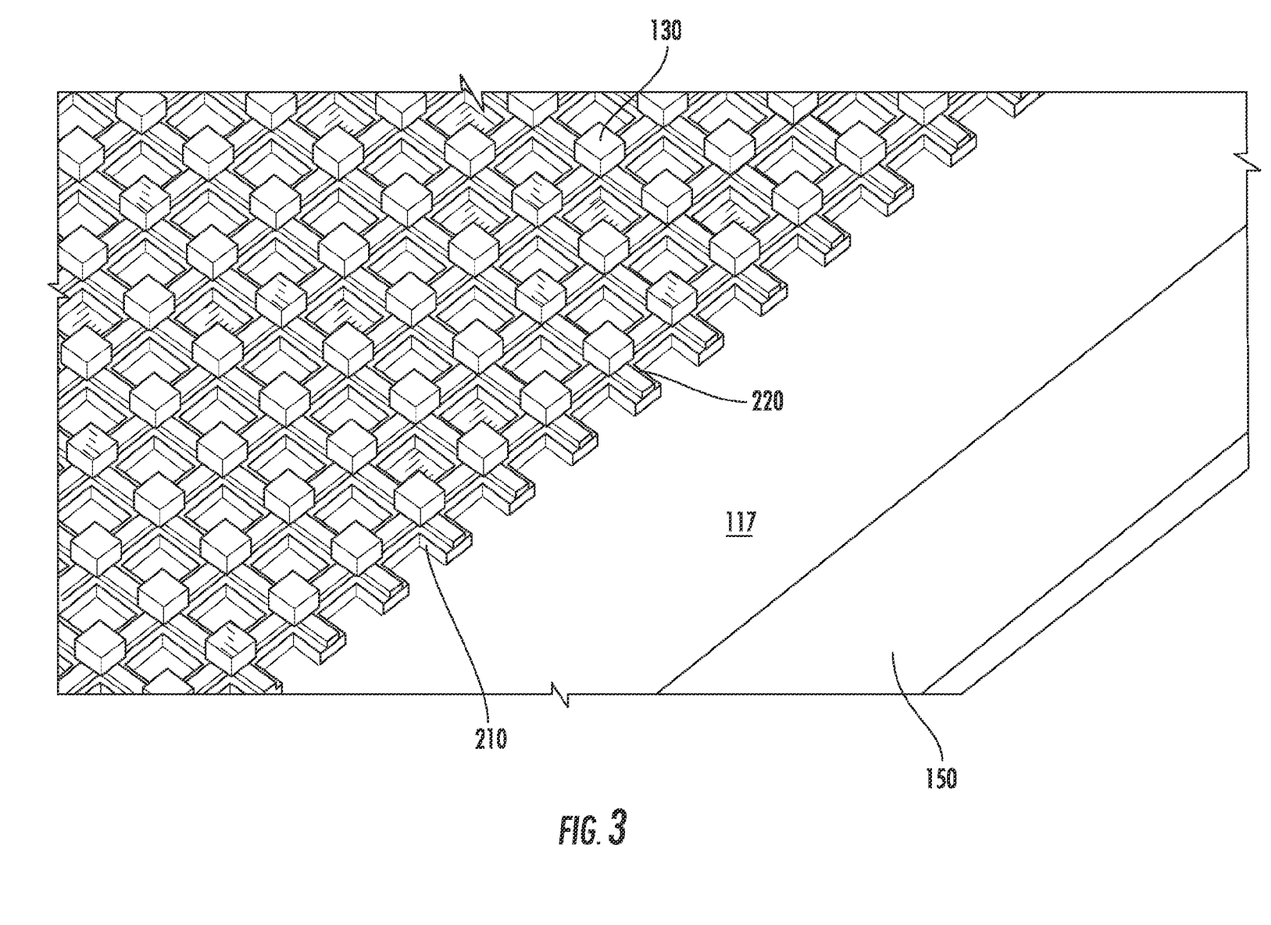
FIG. 3 is an expanded view of the recessed portion of the substrate heating subassembly of FIG. 2.

FIG. 3 shows an expanded view of the recessed portion 117. Disposed directly on the upper surface of the recessed portion 117 is a plurality of insulating traces 210. The insulating traces 210 may cover the entirety of the upper surface of the recessed portion 117. In other embodiments, such as that shown in FIG. 3, the insulating traces 210 are disposed in a pattern, such that portions of the upper surface of the recessed portion 117 remain exposed. Disposed on the insulating traces 210 is a plurality of conductive traces 220. The conductive traces 220 are used to carry current to the LEDs 130. The insulating traces 210 are used to electrically isolate the conductive traces 220 from the recessed portion 117. The conductive traces 220 are electrically connected to a power source (not shown) and to the LEDs 130.

Unlike the previous embodiment, the insulating traces 210 are applied directly to the recessed portion 117. Therefore, fasteners are not employed. Further, since the insulating traces 210 is disposed directly on the upper surface of the recessed portion 117 of the base 110, thermal conductivity may be much improved. In other words, the embodiment of FIG. 2 may be more effective in pulling heat from the LEDs 130 and sinking that heat to the base 110. In certain embodiments, a thick film material system, such as that available from Heraeus Celcion®, may be used.

In both embodiments, the LEDs 130 are part of an electrical circuit that is disposed in the recessed portion 117 of the base 110. Electrical connections are made between the LEDs 130 and a power supply. As described above, in certain embodiments, the electrical circuit is fabricated on a printed circuit board, or a metal core printed circuit board. In other embodiments, the electrical circuit is fabricated using thick films. These films are used to create insulating traces and conductive traces. Of course, the electrical circuit may be fabricated in other ways as well.

Figure 4:
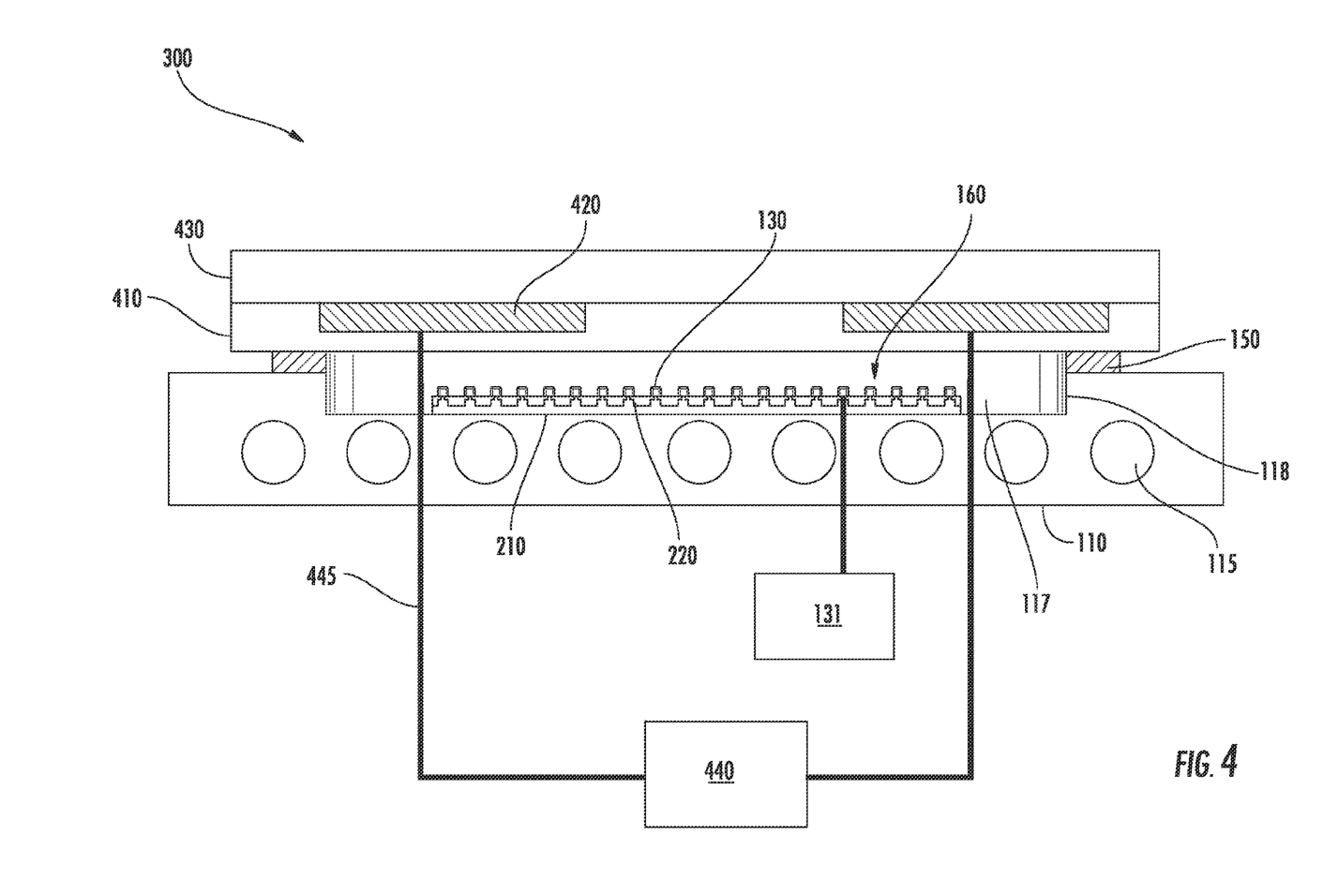
FIG. 4 shows a cross-sectional view of the electrostatic chuck with LED heating according to one embodiment.

FIG. 4 shows a cross section of one embodiment of the electrostatic chuck with LED heating 300. As described above, the electrostatic chuck with LED heating 300 comprises an LED substrate heater subassembly. While FIG. 4 illustrates the components of the LED substrate heater subassembly of FIG. 2, the LED substrate heater subassembly may also be the embodiment shown in FIG. 1. As such, the LED substrate heater subassembly is not limited to this embodiment. The LED substrate heater subassembly comprises a base 110, having conduits 115. A sealing gasket 150 is disposed on the sidewalls 118. Insulating traces 210 and conductive traces 220 are disposed in a recessed portion 117 of the base 110. LEDs 130 are in communication with the conductive traces 220. The conductive traces 220 are also in communication with an LED power supply 131, which supplies power to the LEDs 130. Encapsulate 160 may be disposed in the remaining volume of the recessed portion 117. Disposed on the LED substrate heater subassembly is the electrostatic chuck. The electrostatic chuck comprises a top dielectric layer 430, an interior layer 410, and one or more electrodes 420 disposed between the top dielectric layer 430 and the interior layer 410.

The interior layer 410 is disposed on top of the sidewalls 118 and forms a sealed enclosure in which the electrical circuit is enclosed. The interior layer 410 may be disposed on the sealing gasket 150. As described above, an encapsulate 160 may be used to fill the remaining volume of the sealed enclosure. The interior layer 410 may be in contact with the encapsulate 160. In certain embodiments, the encapsulate 160 may provide support for the interior layer 410.

The interior layer 410 may be a dielectric material or an insulating material. In certain embodiments, the top dielectric layer 430 and the interior layer 410 are constructed of materials that are transparent or nearly transparent at the wavelength emitted by the LEDs 130. For example, more than 80% of the light energy emitted by the LEDs 130 may pass through the top dielectric layer 430 and the interior layer 410. In certain embodiments, the top dielectric layer 430 and the interior layer 410 may be constructed of quartz, glass, borosilicate glass (BSG), sapphire or other suitable materials. In certain embodiments, different materials may be used for the top dielectric layer 430 and the interior layer 410.

Figure 5:
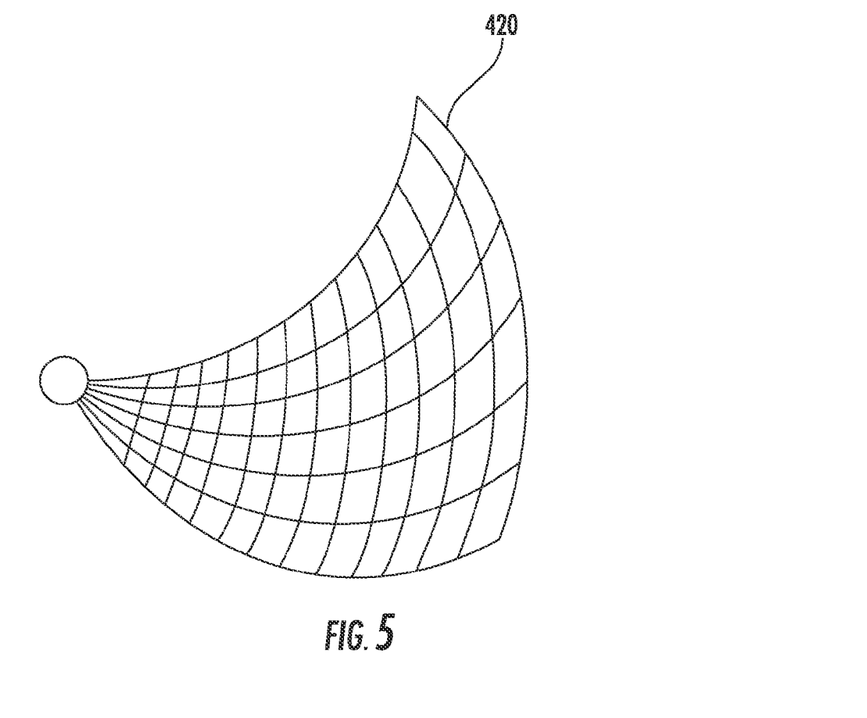
FIG. 5 shows a first embodiment of an electrode.

In certain embodiments, the electrodes 420 may be formed as a mesh. FIG. 5 shows an example of an electrode 420 that is formed as a mesh. In this embodiment, six electrodes 420, each identical to that shown in FIG. 5, may be disposed between the interior layer 410 and the top dielectric layer 430. In this manner, the percentage of the total surface area of the top surface of the interior layer 410 that is covered by the electrodes 420 is small. For example, the electrodes 420 may cover less than 25% of the surface of the interior layer 410. In other embodiments, the electrodes 420 may cover less than 20% of the surface of the interior layer 410. In yet other embodiments, the electrodes 420 may cover less than 10% of the surface of the interior layer 410. Since the electrodes 420 cover a small percentage of the total surface area, they may have a minimal effect on the transmission of light from the LEDs 130, located below the electrodes 420 to the substrate, located above the electrodes 420. As such, the electrodes 420 may be fabricated from any conductive material.

Figure 6:
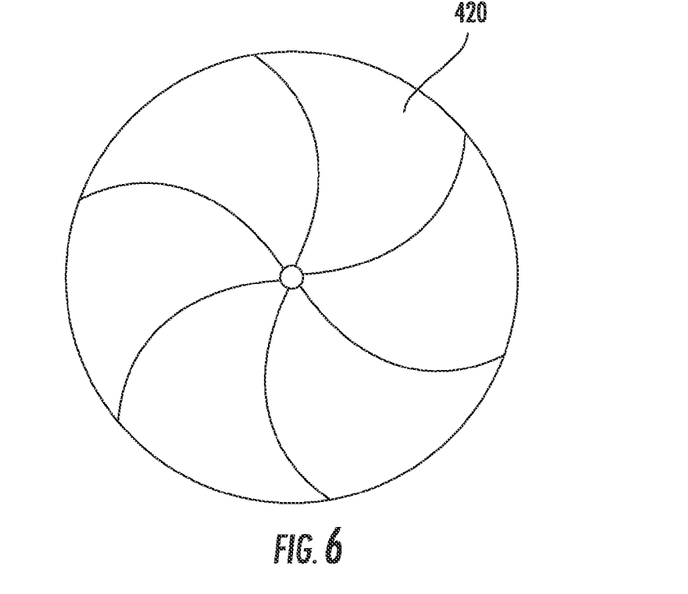
FIG. 6 shows a second embodiment of the electrodes.

In other embodiments, the electrodes 420 may cover the majority of the surface area of the interior layer 410. FIG. 6 shows an embodiment where six electrodes 420 are disposed between the interior layer 410 and the top dielectric layer 430. These electrodes 420 cover most of the surface area of the interior layer 410. However, in this embodiment, the electrodes 420 are fabricated using an electrically conductive material that is transparent or nearly transparent at the wavelength emitted by the LEDs 130. The electrically conductive material may be a doped semiconductor or graphene that is optically transparent. For example, the conductive material may be indium tin oxide (ITO) or aluminum zinc oxide (AZO), although other materials may also be used.

In certain embodiments, the electrodes 420 are disposed in channels in the top surface of the interior layer 410. For example, in certain embodiments, anisotropic or isotropic etching is used to remove material from a portion of the top surface of the interior layer 410 so as to create channels in the top surface of the interior layer 410. An electrically conductive material, such as a metal, ITO or AZO, may then be deposited to fill the channels. The electrically conductive material in the channels of the interior layer 410 forms the electrodes 420.

The top dielectric layer 430 is then applied to the top surface of the interior layer 410. This top dielectric layer 430 may be a dielectric material and may be deposited glass or spun on glass. In other embodiments, a layer of quartz or another type of optically transparent dielectric may be adhered to the interior layer 410 to form the top dielectric layer 430.

The electrodes 420 may be in electrical communication with a power supply 440, which provides the electrical voltages to create the electrostatic forces used to clamp the substrate. In one embodiment, wires 445 pass through the base 110 and electrically connect the electrodes 420 to the power supply 440. In certain embodiments, each electrode 420 is in connection with a corresponding wire 445. In certain embodiments, there is an even number of electrodes 420. Each pair of electrodes 420 may be in electrical communication with a respective bipolar power signal, such as a square wave, such that one electrode of a pair receives the positive output and the other electrode of that pair receives the negative output. The same square wave output, in terms of period and amplitude, is applied to all of the electrodes. However, each square wave output is phase shifted from those adjacent to it. Thus, in one embodiment, there are 6 electrodes 420. One pair of these electrodes is powered by a first square wave, while a second pair of electrodes is powered by a second square wave, which has a phase shift of 120° relative to the first square wave. Similarly, the third square wave is phase shifted 120° from the second square wave. Of course, other configurations are also within the scope of the disclosure.

In operation, the substrate is placed on top of the top dielectric layer 430. Power from power supply 440 is applied to the electrodes 420 so as to clamp the substrate to the electrostatic clamp with LED heating 300. Power is then applied to the LEDs 130 using LED power supply 131 so as to raise the temperature of the substrate through the use of light energy. In some embodiments, the temperature of the substrate may reach 500° C. within 10-15 seconds, although other times are also possible. Once the substrate reaches the target temperature, the power applied by the LED power supply 131 to the LEDs 130 may be reduced so as to maintain the temperature of the substrate at the target temperature. In one embodiment, the power applied to the LEDs 130 as a function of time may be determined based on empirical data, such that the power profile supplied by the LED power supply 131 is constant for each substrate being processed at a given temperature. In other embodiments, closed loop control of the power supplied by LED power supply 131 may be employed. Once the substrate has reached the target temperature, the substrate may be processed. Following processing of the substrate, the power applied to the LEDs 130 by the LED power supply 131 is disabled to stop the heating of the substrate. The power applied to the electrodes 420 is then disabled, so that the substrate may be removed from the top dielectric layer 430.

Figure 7:
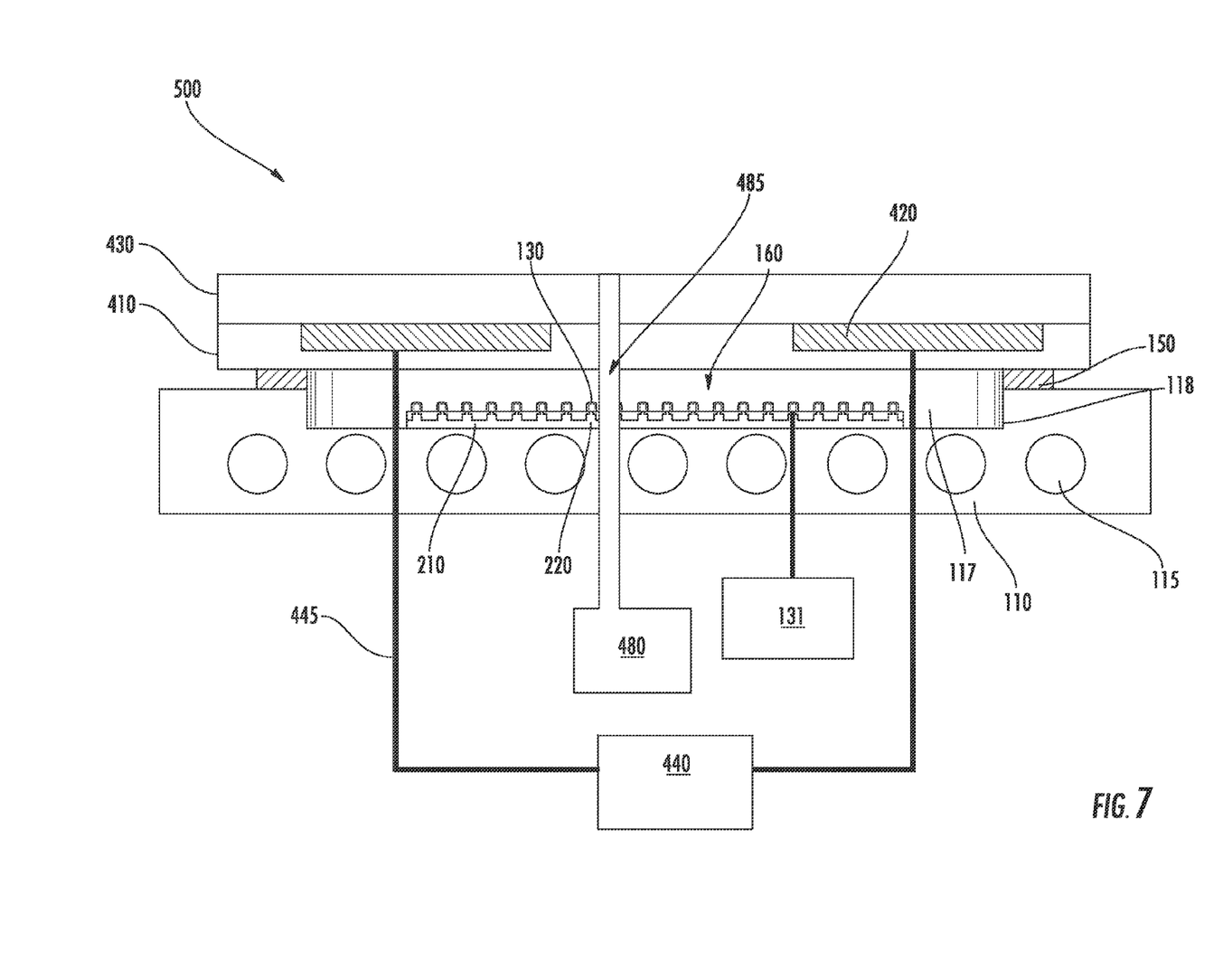
FIG. 7 shows a cross-sectional view of the electrostatic chuck with LED heating according to another embodiment.

FIG. 7 shows a second embodiment of the electrostatic chuck with LED heating 500. The embodiment of FIG. 7 is similar to that of FIG. 4. Components that are shared between these two embodiments have been given identical reference designators. Like the embodiment of FIG. 4, the electrostatic chuck with LED heating 500 comprises a base 110 having a plurality of conduits 115 therethrough. The base 110 has a recessed portion 117 where a plurality of LEDs 130 is disposed. The LEDs 130 are connected to an electrical circuit, such as insulating traces 210 and conductive traces 220. In other embodiments, the LEDs 130 are disposed on a printed circuit board. The LEDs 130 are in communication with a LED power supply 131. The electrostatic chuck with LED heating 500 also includes a top dielectric layer 430, an interior layer 410 with one or more electrodes 420 disposed therebetween. A power supply 440 is in electrical communication with the electrodes 420, such as through wires 445.

A gas source 480 is in fluid communication with a cooling conduit 485. The cooling conduit 485 may extend through the electrostatic chuck with LED heating 500 and open to the top surface of the top dielectric layer 430. In this way, cooling gas from the gas source 480 may be flowed to the top of the electrostatic chuck with LED heating 500, to the volume between the top dielectric layer 430 and the underside of the substrate.

Unlike conventional electrostatic chucks, this gas source is used to cool the substrate after processing. As described above, the substrate is heated by light energy emitted from the LEDs 130. Consequently, the electrostatic chuck with LED heating 500 is actually much cooler than the substrate. Therefore, after processing the substrate, cooling gas is supplied through cooling conduit 485. This cooling gas increases the conduction of heat between the substrate and the top dielectric layer 430, removing heat from the substrate.

Figure 8:
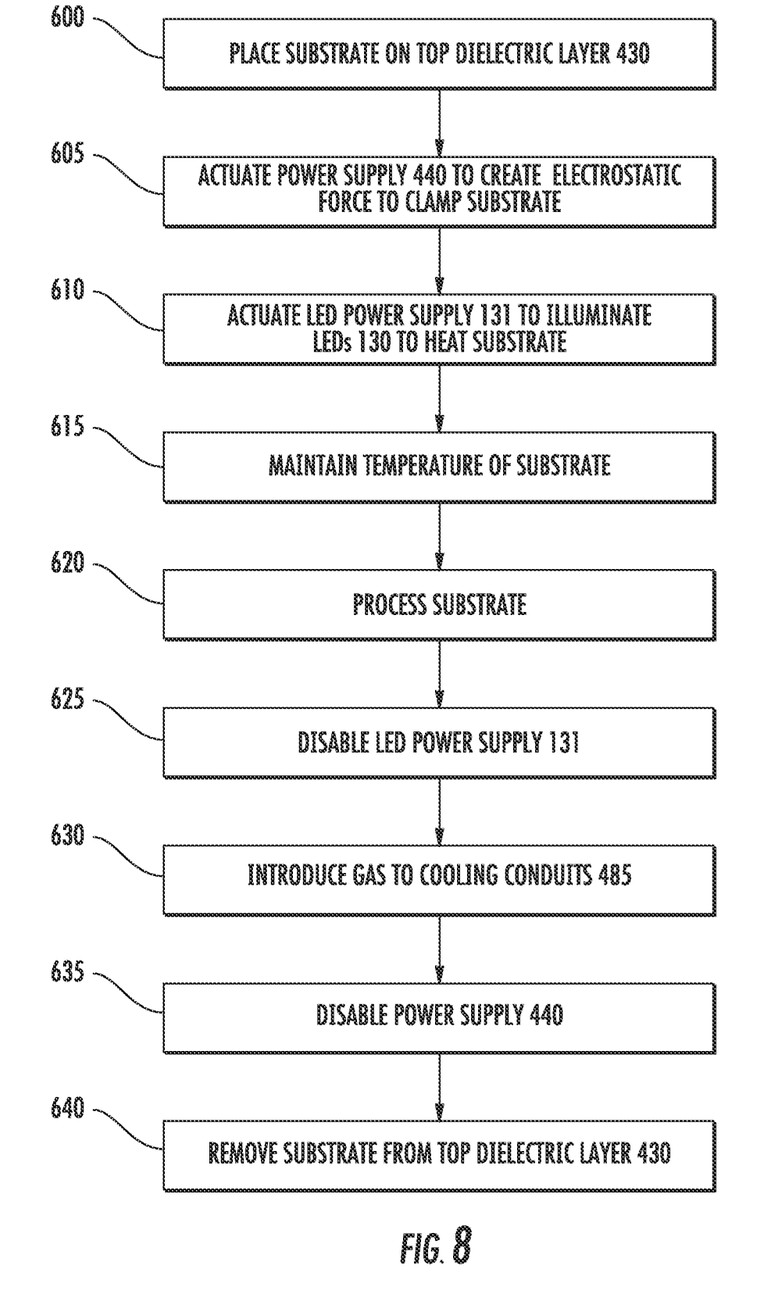
FIG. 8 shows a process flow for processing the substrate according to one embodiment.

FIG. 8 shows a process sequence used to process a substrate. First, as shown in process 600, the substrate is placed on the top dielectric layer 430. After this, as shown in process 605, the power supply 440 is actuated, supplying power to the electrodes 420. This power creates an electrostatic force, which serves to clamp the substrate to the top dielectric layer 430. Once the substrate is clamped to the electrostatic chuck, the LED power supply 131 may be actuated, as shown in process 610. This supplies power to the LEDs 130, which serves to heat the substrate through radiant energy. A first power level may be applied to the LEDs 130, which is used to bring the substrate to the target temperature. Once the target temperature is reached, the electrostatic chuck maintains this target temperature, as shown in process 615. In one embodiment, a second power level, which may be lower than the first power level, is applied to the LEDs 130 to maintain the target temperature. In another embodiment, the power to the LEDs 130 may be modulated at a duty cycle less than 100% to maintain the target temperature. Other methods of maintaining the temperature of the substrate may also be employed. While the substrate is at the target temperature, the substrate may be processed, as shown in process 620. After processing the substrate, the LED power supply 131 may be disabled, as shown in process 625. This stops the heating of the substrate.

In certain embodiments, as shown in process 630, gas is introduced to cooling conduits 485. This gas increases the conduction of heat from the substrate to the top dielectric layer 430, allowing the substrate to cool faster than would otherwise occur. In other embodiments, such as the electrostatic chuck of FIG. 4, gas may not be used to cool the substrate. When the substrate has sufficiently cooled, the power supply 440 is disabled, as shown in process 635. This disables the electrostatic force that held the substrate in place. After this, the substrate may be removed from the top dielectric layer 430, as shown in process 640.

The embodiments described above in the present application may have many advantages. First, as described above, the electrostatic chuck utilizes LED heating to warm the substrate. Consequently, the electrostatic chuck is subject to much lower temperature excursions than are experienced by traditional electrostatic chucks. This reduces thermal stresses within the electrostatic chuck, which may serve to increase the reliability of the electrostatic chuck. Second, the electrostatic chuck described herein may be used for hot, cold and room temperature implants. Because of the limited thermal stress within the electrostatic chuck, the chuck is able to operate in different environments without issue. Third, unlike prior art electrostatic chucks, the present electrostatic chuck may also be used to cool the substrate after the substrate has been processed. Since the temperature of the electrostatic chuck remains lower than that of the substrate, the chuck may be used as a thermal sink to remove heat from the substrate after processing. Fourth, conventional heated chucks are kept at their elevated temperatures to reduce thermal cycling. Therefore, in many applications, the substrates are preheated before being placed on these chucks. Since the present electrostatic chuck does not heat to the extreme temperatures experienced by conventional chucks, there may be no heat to preheat the substrates before they are placed on the electrostatic chuck with LED heating. Additionally, because the heating is achieved through the use of light energy, it may be possible to heat the substrate to higher temperatures than may be done using conventional systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus comprising:
a sealed enclosure containing an electrical circuit comprising a plurality of LEDS, wherein a top surface of the sealed enclosure comprises an electrostatic chuck, wherein the sealed enclosure comprises a base having a recessed portion defined by sidewalls, and the electrical circuit is disposed in the recessed portion and wherein light from LEDS is adapted to directly heat a substrate disposed on the electrostatic chuck.

2. The apparatus of claim 1, wherein the electrostatic chuck comprises:
an interior layer in communication with the sealed enclosure;
a top dielectric layer; and
an electrode disposed between the interior layer and the top dielectric layer.

3. The apparatus of claim 1, wherein the sealed enclosure is filled with an encapsulate to remove air.

4. The apparatus of claim 1, wherein the plurality of LEDs emits light at a wavelength between about 0.4 and 1.0 μm.

5. An electrostatic chuck with LED heating, comprising:
a base having a recessed portion defined by sidewalls;
an electrical circuit, comprising a plurality of LEDs, disposed in the recessed portion;
an interior layer disposed on top of the sidewalls and covering the recessed portion;
a top dielectric layer; and
an electrode disposed between the interior layer and the top dielectric layer, wherein the interior layer and the top dielectric layer are transparent at a wavelength emitted by the plurality of LEDs, such that light from LEDS is adapted to directly heat a substrate disposed on the top dielectric layer, such that the substrate is heated to a higher temperature than the electrostatic chuck.

6. The electrostatic chuck of claim 5, wherein the electrical circuit comprises a printed circuit board, and the printed circuit board is in thermal communication with an upper surface of the recessed portion.

7. The electrostatic chuck of claim 5, wherein the electrical circuit comprises insulating traces and conductive traces, wherein the insulating traces are applied directly to an upper surface of the recessed portion, the conductive traces are applied on top of the insulating traces, and the conductive traces are in electrical communication with the plurality of LEDs.

8. The electrostatic chuck of claim 5, further comprising an encapsulate which fills a remaining volume of the recessed portion.

9. The electrostatic chuck of claim 8, wherein the encapsulate is transparent at the wavelength emitted by the plurality of LEDs.

10. The electrostatic chuck of claim 9, wherein the encapsulate comprises silicone.

11. The electrostatic chuck of claim 5, wherein the plurality of LEDs is arranged as a pattern of concentric circles, where concentric circles disposed further from a center of the pattern have more LEDs than concentric circles disposed closer to the center of the pattern.

12. The electrostatic chuck of claim 5, comprising a conduit passing through the top dielectric layer, the interior layer and the base, in fluid communication with a gas source, to allow gas to be introduced to a volume between the top dielectric layer and an underside of a substrate disposed on the electrostatic chuck.

13. The electrostatic chuck of claim 5, wherein the electrode is formed as a mesh, such that the electrode occupies less than 25% of a surface of the interior layer.

14. The electrostatic chuck of claim 5, wherein the electrode is formed using a material that is transparent at the wavelength emitted by the plurality of LEDs.

15. The electrostatic chuck of claim 5, wherein the plurality of LEDs emits light at a wavelength between about 0.4 and 1.0 μm.

16. An electrostatic chuck with LED heating, comprising:
a base having a recessed portion defined by sidewalls;
an electrical circuit, comprising a plurality of LEDs, disposed in the recessed portion;
an interior layer disposed on top of the sidewalls and covering the recessed portion to form a sealed enclosure;
an encapsulate filling a remaining volume of the sealed enclosure;
a top dielectric layer; and
an electrode disposed between the interior layer and the top dielectric layer, wherein the encapsulate, the interior layer, the electrode and the top dielectric layer are transparent at a wavelength emitted by the plurality of LEDs, such that light from LEDS is adapted to directly heat a substrate disposed on the top dielectric layer, such that the substrate is heated to a higher temperature than the electrostatic chuck.

17. The electrostatic chuck of claim 16, wherein the electrode comprises a doped semiconductor.

18. The electrostatic chuck of claim 16, further comprising a conduit extending through the base, the encapsulate, the interior layer and the top dielectric layer, in fluid communication with a gas source, to allow gas to be introduced to a volume between the top dielectric layer and an underside of a substrate disposed on the electrostatic chuck.

19. The electrostatic chuck of claim 16, wherein the plurality of LEDs emits light at a wavelength between about 0.4 and 1.0 μm.

20. The electrostatic chuck of claim 16, wherein the plurality of LEDs are arranged as a pattern of concentric circles, where concentric circles disposed further from a center of the pattern have more LEDs than concentric circles disposed closer to the center of the pattern.

* * * * *